United States Patent [19]
Pramanick et al.

[11] Patent Number: 6,117,770
[45] Date of Patent: Sep. 12, 2000

[54] METHOD FOR IMPLANTING SEMICONDUCTOR CONDUCTIVE LAYERS

[75] Inventors: Shekhar Pramanick, Fremont; Dirk Brown, Santa Clara; John A. Iacoponi, San Jose; Christy Mei-Chu Woo, Cupertino, all of Calif.

[73] Assignee: Advanced Micro Devices, Inc., Sunnyvale, Calif.

[21] Appl. No.: 09/169,281

[22] Filed: Oct. 8, 1998

[51] Int. Cl.$^7$ .................................................. H01L 21/44
[52] U.S. Cl. ............................ 438/659; 438/687; 438/633
[58] Field of Search .................................... 438/659, 687, 438/633, 692, 693

[56] References Cited

U.S. PATENT DOCUMENTS 5,843,840  12/1998  Miyazaki et al. ........................ 438/659

*Primary Examiner*—Caridad Everhart

[57] ABSTRACT

A method for implanting copper conductive layers in channel or via openings with alloying elements, such as magnesium, boron, tin, and zirconium. The implantation is performed after conductive layer chemical-mechanical-polishing (CMP) using a surface barrier layer as an implant barrier. With the surface barrier layer being removed by barrier layer CMP, this allows directed, heavy implantation of the conductive layer with the alloying elements.

20 Claims, 2 Drawing Sheets

METHOD FOR IMPLANTING SEMICONDUCTOR CONDUCTIVE LAYERS

TECHNICAL FIELD

The present invention relates generally to semiconductors and more specifically to implanting conductive layers.

BACKGROUND ART

While manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as barrier materials for copper. A thin adhesion layer formed of an adhesion material, such as tantalum (Ta), titanium (Ti), or tungsten (W) is first deposited on the dielectrics or vias to ensure good adhesion and good electrical contact of the subsequently deposited barrier layers to underlying doped regions and/or conductive channels. Adhesion/barrier layer stacks formed of adhesion/barrier materials such Ta/TaN, Ti/TiN, and W/WN have been found to be useful as adhesion/barrier material combination for copper interconnects.

However, even with the various types of barrier layers, copper is still subject to strong electro-migration, or the movement of copper atoms along the channels or vias under the influence of electrical current. Electro-migration also tends to occur at the copper/barrier interface. In addition, copper has poor surface adhesion to the barrier layers.

A solution, which would form a copper conductive channel with less electromigration and better surface adhesion has been long sought. The difficulty is that many approaches result in an increase in the electrical resistance. As the semiconductor industry is moving from aluminum to copper and other type of materials with greater electrical conductivity and diffusiveness through dielectrics, it is becoming more pressing that a solution be found.

DISCLOSURE OF THE INVENTION

The present invention provides a method for implanting conductive layers in channel or via openings with an implant material, such as an alloying element, after conductive layer chemical-mechanical-polishing (CMP) using the surface barrier layer as an implant barrier. With the surface barrier layer being removed by barrier layer CMP, this allows directed, heavy implantation of the conductive layer with alloying elements which substantially reduce electro-migration, improve surface adhesion, and do not reduce electrical conductivity.

The present invention provides a method for implanting copper conductive layers in channel or via openings with alloying elements, such as magnesium, boron, tin, and zirconium. The implantation is performed after conductive layer chemical-mechanical-polishing (CMP) using the surface barrier layer as an implant barrier. With the surface barrier layer being removed by barrier layer CMP, this allows directed, heavy implantation of the conductive layer with alloying elements which substantially reduce electro-migration, improve surface adhesion, and do not reduce electrical conductivity.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
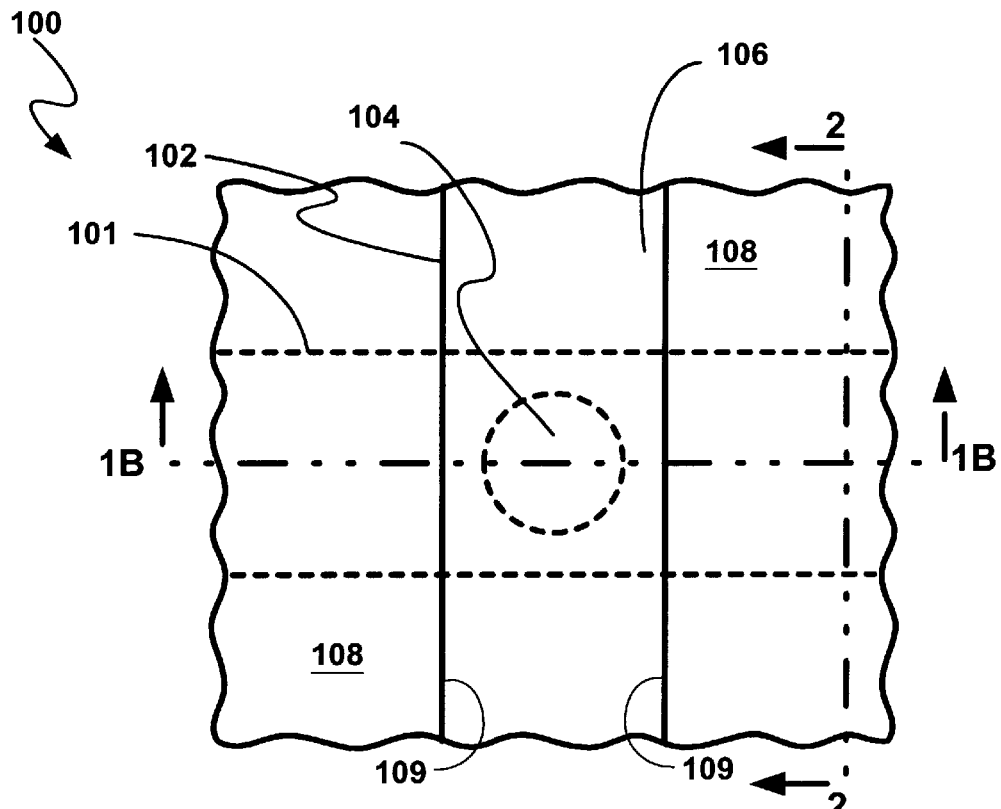
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
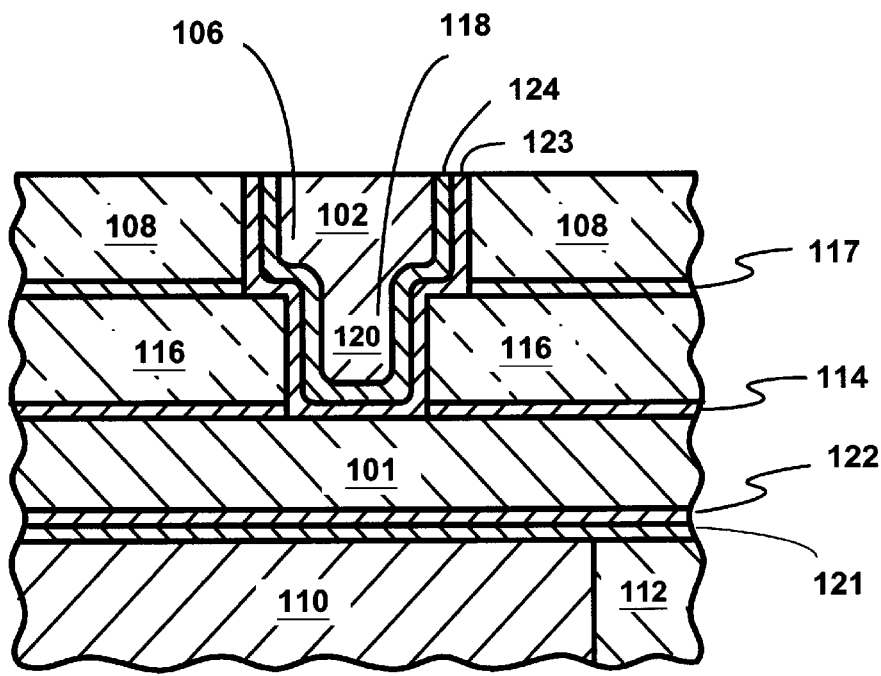
FIG. 1B (PRIOR ART) is a cross-section of FIG. 1A (PRIOR ART) along line 2—2.

Referring now to FIG. 1B (PRIOR ART), therein is shown a cross-section of FIG. 1A (PRIOR ART) along 1B—1B. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are an optional adhesion layer 121 and a barrier layer 122, and around the second channel 102 and the cylindrical via 120 is an optional adhesion layer 123 and barrier layer 124. Barrier layers include barrier materials and, where necessary, are used to prevent diffusion of the conductive materials into the adjacent areas of the semiconductor.

Figure 2:
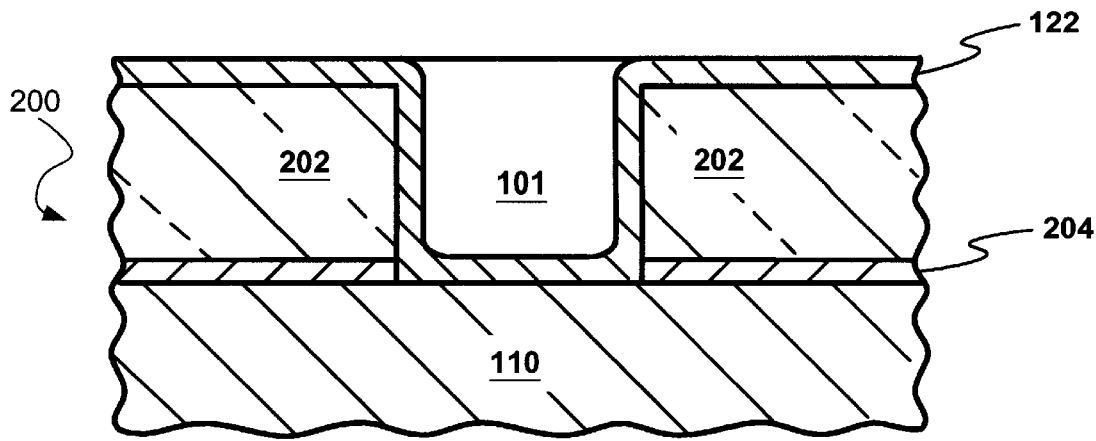
FIG. 2 is a simplified cross-section of a partially processed semiconductor wafer after CMP of conductive material.

Referring now to FIG. 2, therein is shown the cross-section of a semiconductor wafer 200 in a preliminary stage of manufacture. Strictly for ease of understanding, the completed semiconductor wafer 200 can be understood to be the equivalent of the semiconductor wafer 100 taken along the line 2—2. Thus, the cross-section of FIG. 2 shows the cross-section of semiconductor wafer 200 after the deposition of the adhesion barrier 121 (not shown to simplify explanation) and the barrier layer 122 and the first channel 101. The barrier layer 122 would also be formed of adhesion/barrier materials such as Ta/TaN, Ti/TiN, W/WN, and the first channel 101 would be formed of copper or a copper alloy. The surface of the first channel 101, as shown, has been chemical-mechanical polished to be level with the barrier layer 122. For purpose of clarity, the adhesion layer 121 and the dielectric 112 are not shown while via oxide layer 202 and a stop nitride layer 204 are shown for the first channel 101.

Figure 3:
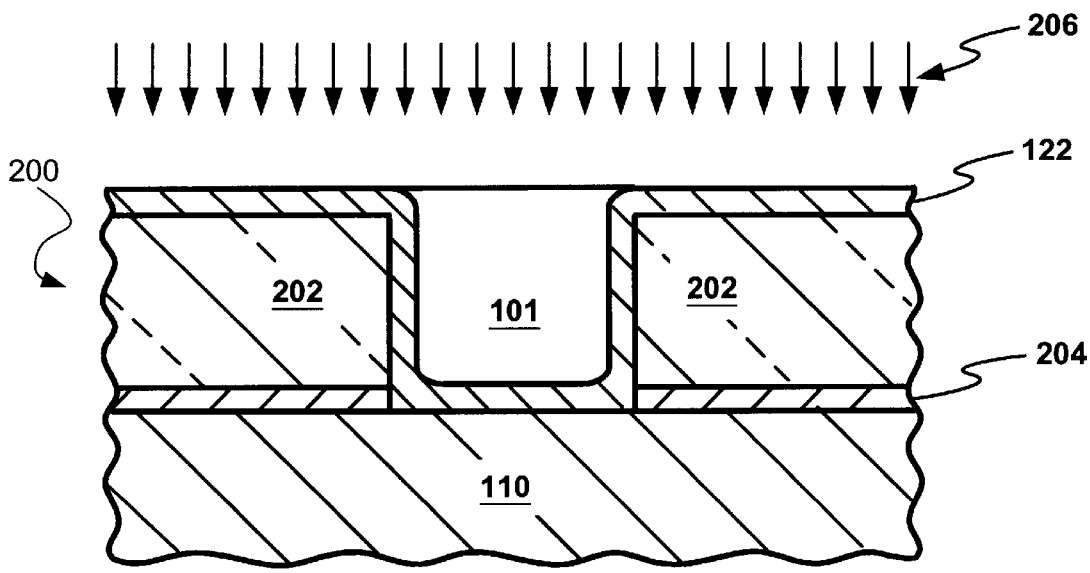
FIG. 3 is a simplified cross-section of FIG. 2 during implantation.

Referring now to FIG. 3, therein is shown the cross-section of the semiconductor wafer 200 during the implantation 206 of an implant material, such as an alloying element. The alloying elements which can be implanted include, but are not limited to, magnesium, boron, tin, zirconium, carbon, or combinations thereof They are elements which will significantly reduce electro-migration of copper or the movement of copper atoms along the channels or vias under the influence of electrical current. These dopants have two effects. First, they act to slow the lattice and grain boundary diffusion of copper atoms. Second, depending on the dopant and concentration, they can slow the migration of copper atoms along the copper/barrier interface or a copper/passivation interface. These dopants will also increase surface adhesion after annealing as will hereinafter be described.

Figure 4:
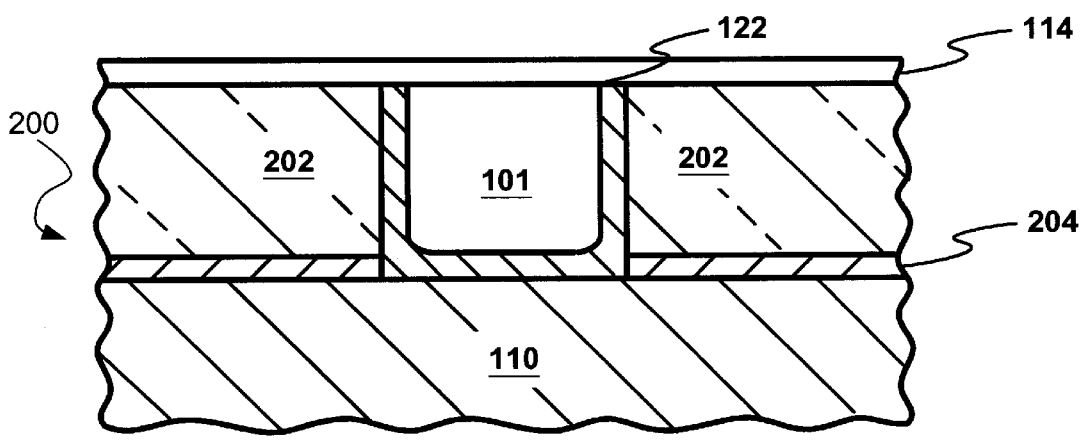
FIG. 4 is a simplified cross-section of FIG. 3 after barrier layer CMP.

Referring now to FIG. 4, therein is shown the cross-section of the semiconductor wafer 200 after the implantation and CMP of the barrier layer 122. The CMP removes the dense barrier layer 122 with the implanted element it contains. After barrier layer CMP, a second stop nitride layer 114 is deposited and the wafer 200 subject to annealing to activate the implant element, drive it into the copper, and form the copper alloy.

In production in the past, a conventional first damascene process was used to put down over a production semiconductor wafer 100 a first channel 101 in a first channel oxide layer (not shown) above portions of a semiconductor device (not shown). The damascene process is a photolithographic process which uses a mask to define a first channel opening (not shown) in the first channel oxide layer. The first channel opening is then filled with the thin adhesive layer 121, the thin barrier layer 122, and the first conductive material, such as copper, to form the first channel 101 using conventional metal deposition technique, such as physical vapor deposition, chemical vapor deposition, electroplating, or a combination thereof. The top surface would then be subject to CMP.

For the second channel 102, the stop nitride layer 114, the via oxide layer 116, and the via nitride layer 117 would be successively deposited on top of the first channel 101 and the first channel oxide layer using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the 102 to be perpendicular to the first channel 101.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first channel 201 and completes the etching steps. The second channel opening 106 is then filled with the thin adhesive layer 123, the thin barrier layer 124, and the second conductive material. The second conductive material is also a conductor, such as copper, to form the second channel 102 using conventional metal deposition technique, such as physical vapor deposition, chemical vapor deposition, electroplating, or a combination thereof. A CMP process is used to level the second channel 102 to form the structure shown in FIG. 1B.

Next, the second conductive material is deposited into second channel opening 106 and via opening 118 using conventional metal deposition technique, such as physical vapor deposition, chemical vapor deposition, electroplating, or a combination thereof. Thereafter, a chemical mechanical polishing process is used to complete the conventional process similar to what is shown in FIG. 1A and 1B.

In production with the present invention, said steps are the same through the first damascene process of filling the first channel opening with the thin adhesive layer 121, the thin barrier layer 122, and the first conductive material. At this point, the CMP would be used to remove the first conductive material down to the barrier layer 122 rather than all the way down to the via oxide layer 202. The semiconductor wafer 200 at this point would be subject to the implantation 206 of the alloying element. The alloying elements which can be implanted include, but are not limited to, magnesium, boron, tin, zirconium, carbon, or combinations thereof. The dose of the dopant, or implanted species, should be such that after the semiconductor wafer 200 is annealed and the implanted species distributed through the copper, the resultant concentration of the implanted species is between 0.1 and 2.0% atomic concentration. The energy of the implant should be such that the implanted species does not penetrate through the barrier material 122 covering the dielectric 202. More specifically, the implant range (Rp) plus straggle (ΔRp) are within the thickness of the barrier material 122. It should be noted that the surface portion of the barrier layer 122 is heavily implanted, acts as an implant barrier, and protects the via oxide layer 202 from the implantation 206.

After the implantation 206 is complete, the barrier layer 122 is subject to CMP and the surface portion thereof is removed and the via oxide layer 202 is exposed. At this point, or after deposition of a protective stop nitride layer 114, the semiconductor wafer 200 is subject to annealing to activate the implant element, drive it into the copper, and form the copper alloy. The electro-migration is reduced by the solute effect of the implant element and by the reduction of interface diffusion.

With the stop nitride layer 114 in place, the second damascene process is performed.

The second conductive material CMP is performed down to the barrier layer 124, the implantation 206 is performed again, and the barrier CMP is also performed. After the barrier CMP and anneal, the damascene semiconductor wafer processing can be repeated for additional levels of channels.

While the best mode utilizes copper as the conductive material, it should be understood that the present invention is applicable to other conductive materials such as aluminum, tungsten, doped polysilicon, copper-base alloys, gold, gold-base alloys, silver, and silver-base alloys.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising said steps of:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming a barrier layer over said dielectric layer and in said opening, including along said walls, said barrier layer formed to a thickness insufficient to fill said opening;

forming a conductive layer over said barrier layer and in said opening, including along said walls, said [barrier] conductive layer formed to a thickness sufficient to fill said opening;

removing said conductive layer to said barrier layer outside said opening;

implanting an implant material into said conductive layer and said barrier layer after said step of removing said conductive layer to said barrier layer outside said opening; and removing said barrier layer outside said opening.

2. The method as claimed in claim 1 wherein said step of implanting said implant material uses an element selected from a group comprising magnesium, boron, tin, zirconium, carbon, and combinations thereof.

3. The method as claimed in claim 1 including a step of annealing said implant material and wherein said step of implanting said implant material is performed such that the dose after anneal is between 0.1% and 2.0% by atomic concentration.

4. The method as claimed in claim 1 including a step of annealing said implant material after said step of removing said barrier layer.

5. The method as claimed in claim 1 including a step of:

forming an adhesion layer on said dielectric layer and in said opening, including along said walls, in contact with said region of said semiconductor substrate to bond said barrier layer thereto.

6. The method as claimed in claim 1 including the steps of:

forming an adhesion layer on said dielectric layer and in said opening, including along said walls, in contact with said region of said semiconductor substrate to bond said barrier layer thereto; and forming of said adhesion layer is performed with a material selected from a group comprising titanium, tantalum, tungsten, and combinations thereof.

7. The method as claimed in claim 1 wherein said step of forming said barrier layer is performed with a material selected from a group comprising tantalum, tantalum nitride, titanium, titanium nitride, tungsten, tungsten nitride, and combinations thereof.

8. The method as claimed in claim 1 wherein said step of forming said conductive layer is performed with a material selected from a group comprising aluminum, tungsten, doped polysilicon, copper, gold, silver, alloys thereof and combinations thereof.

9. The method as claimed in claim 1 wherein said region is a conductive channel formed on said semiconductor.

10. The method as claimed in claim 1 wherein said region is a doped region formed on said semiconductor substrate.

11. A method of manufacturing a semiconductor device, comprising said steps of:

provide a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming an adhesion layer on said dielectric layer and in said opening, including along said walls, in contact with said region of said semiconductor substrate, said adhesion layer formed to a thickness insufficient to fill said opening;

forming a barrier layer in contact with said adhesion layer, said barrier layer formed to a thickness insufficient to fill said opening;

forming a layer of conductive material in contact with said barrier layer, said conductive material layer substantially fills said opening;

removing said conductive layer to said barrier layer outside said opening;

implanting an implant material into said conductive layer and said barrier layer after said step of removing said conductive layer to said barrier layer outside said opening; and removing said adhesion layer and said barrier layer outside said opening.

12. The method as claimed in claim 11 wherein said step of implanting said implant material uses an element selected from a group comprising magnesium, boron, tin, zirconium, carbon, and combinations thereof.

13. The method as claimed in claim 11 wherein said step of implanting said implant material is performed such that the dose after anneal is between 0.1% and 2.0% by atomic concentration and within said barrier layer.

14. The method as claimed in claim 11 including a step of annealing said implant material after said step of removing said adhesion layer and said barrier layer.

15. The method as claimed in claim 11 wherein said step of forming said adhesion layer is performed with a material selected from a group comprising titanium, tantalum, tungsten, and combinations thereof.

16. The method as claimed in claim 11 wherein said step of forming said barrier layer is performed with a material selected from a group comprising tantalum, tantalum nitride, titanium, titanium nitride, tungsten, tungsten nitride and combinations thereof.

17. The method as claimed in claim 11 wherein said step of forming said layer of conductive material is performed with a material selected from a group comprising aluminum, tungsten, doped polysilicon, copper, gold, silver, and combinations thereof.

18. The method as claimed in claim 11 wherein said region is a conductive channel formed on said semiconductor device.

19. The method as claimed in claim 11 wherein said region is a doped region formed on said semiconductor device.

20. A method of manufacturing a semiconductor device, comprising said steps of:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming an adhesion layer comprising a material selected from a group consisting of titanium and tantalum on said dielectric layer and in said opening, including along said walls, in contact with said region of said semiconductor substrate, said adhesion layer formed to a thickness insufficient to fill said opening, wherein said step of forming said adhesion layer is performed by a process selected from a group comprising physical vapor deposition, chemical vapor deposition, and a combination thereof, forming a barrier layer comprising a material selected from a group comprising titanium nitride, tantalum, tantalum nitride, and tungsten nitride in contact with said adhesion layer, said barrier layer formed to a thickness insufficient to fill said opening, wherein said step of forming said barrier layer is performed by a process selected from a group comprising physical vapor deposition, chemical vapor deposition, and a combination thereof;

forming a conductive layer comprising a material selected from a group consisting of aluminum, tungsten, doped polysilicon. copper, gold, silver, and combinations thereof, said conductive material in contact with said barrier layer and substantially filling said opening;

removing said conductive layer to said barrier layer outside said opening by chemical-mechanical-polishing;

implanting an implant material into said conductive layer and said barrier layer, wherein said step of implanting said implant material is performed with an implant material selected from a group magnesium, boron, tin, zirconium, carbon and a combination thereof, removing said barrier layer outside said opening by chemical-mechanical-polishing; and annealing said semiconductor device.

* * * * *